United States Patent [19]

Chinery

[11] 4,114,096

[45] Sep. 12, 1978

[54] METHOD OF TESTING SEMICONDUCTOR DEVICES

[75] Inventor: Jack Joseph Chinery, Raritan, N.J.

[73] Assignee: RCA Corporation, New York, N.Y.

[21] Appl. No.: 790,199

[22] Filed: Apr. 25, 1977

[51] Int. Cl.² .......................................... G01R 31/22
[52] U.S. Cl. ........................... 324/158 D; 324/158 F; 324/158 T
[58] Field of Search ........... 324/158 F, 158 R, 158 D, 324/158 T, 73 R

[56] References Cited

U.S. PATENT DOCUMENTS

| | | | |
|---|---|---|---|
| 3,659,199 | 4/1972 | Knutson | 324/158 D |
| 3,665,307 | 5/1972 | Cocca | 324/158 D |
| 3,710,251 | 1/1973 | Hagge et al. | 324/158 F |
| 3,761,808 | 9/1973 | Ryan | 324/158 F |

*Primary Examiner*—Rudolph V. Rolinec
*Assistant Examiner*—Ernest F. Karlsen
*Attorney, Agent, or Firm*—H. Christoffersen; R. A. Hays

[57] ABSTRACT

A method of testing semiconductor devices at low temperatures comprises the steps of first directing a relatively cold fluid upon the device for a time long enough to reduce the temperature thereof below the temperature at which it is to be tested, then internally heating the device to the test temperature and then performing a test at the testing temperature.

8 Claims, 1 Drawing Figure

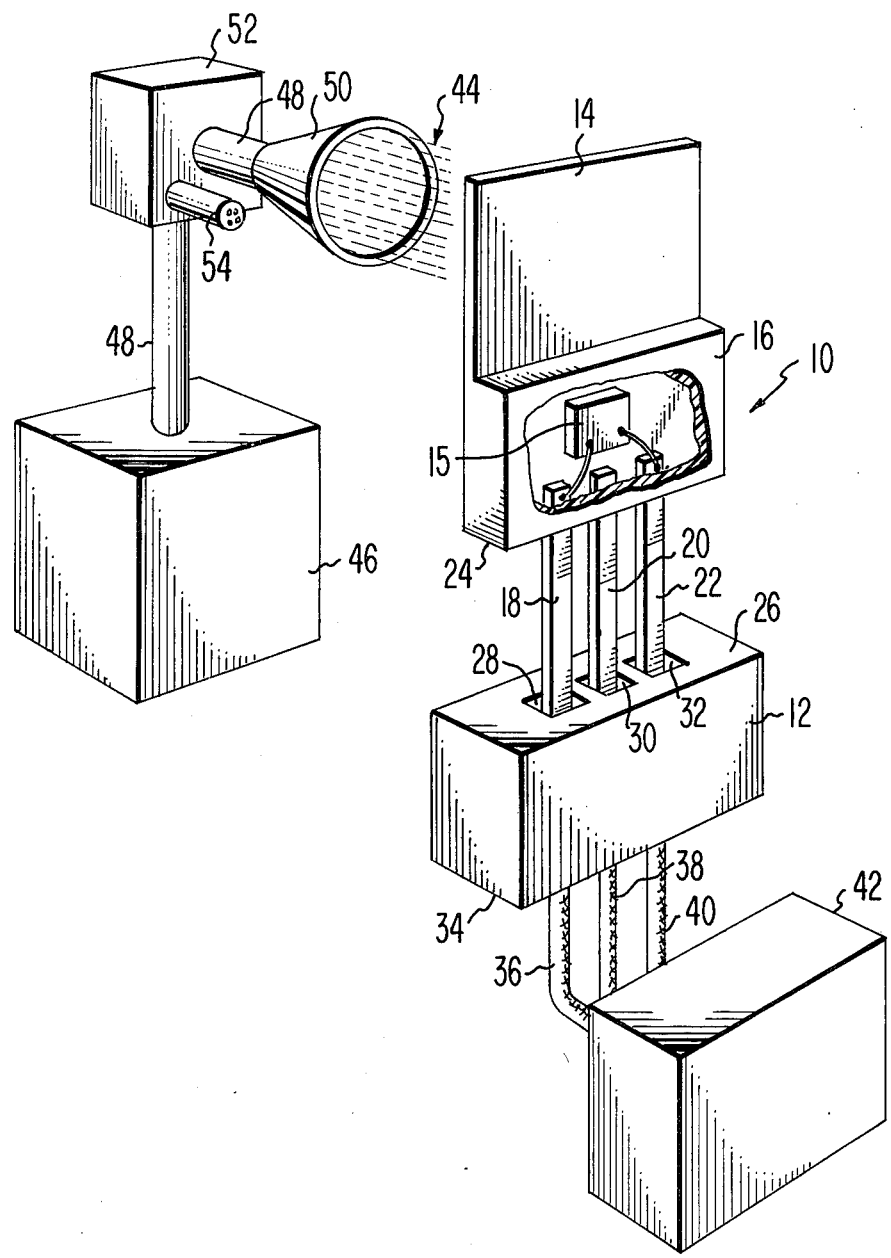

METHOD OF TESTING SEMICONDUCTOR DEVICES

The present invention relates generally to a method of testing semiconductor devices and, in particular, relates to a method of testing semiconductor devices at a low temperature.

As the use of semiconductor devices expands into new fields, such as automotive electronics, more stringent requirements are imposed on their performance. One example wherein such requirements are imposed is that devices are now required to be capable of operating at very low temperatures, such as about −40° C. In order to determine whether or not a particular semiconductor device will operate at these temperatures, finished devices must be tested at low temperatures before they are delivered to a customer. Conventional methods of testing semiconductor devices at low temperatures involve placing a plurality of such devices in a conventional temperature chamber and reducing the ambient temperature therein to the desired test temperature. One limitation of such a method is that it generally takes about one-half hour to reduce the temperature within the chamber to the test temperature. Since the number of devices capable of fitting inside a given chamber is limited, this half-hour cycle occurs every time a new batch of devices is tested. Such a prolonged waiting period is quite inefficient for production line techniques.

The present invention comprises a low temperature testing method which not only reduces the time necessary to reach the test temperature but which is also compatible with present production line techniques.

The single FIGURE of the drawing shows the various pieces of apparatus, not drawn to scale, comprising a test station utilizing the principles of the present invention.

In the method embodying the principles of the present invention, a typical semiconductor device, indicated generally at 10 in the drawing, is placed in a test socket 12. While this discussion is directed to the testing of a particular semiconductor device it will be recognized that any semiconductor device having at least one PN junction therein may be tested by this method. The device 10 depicted in the FIGURE comprises a heat sink 14 of thermally conductive material on which a semiconductor chip 15 is integrally mounted. The device 10 further comprises a plastic body 16 which overlies and substantially surrounds the semiconductor chip 15 and the heat sink 14. A plurality of terminals 18, 20 and 22 extend from one end 24 of the body 16. These leads are internally connected to the semiconductor chip 15 within the body 16. In this example, the semiconductor device 10 is a transistor and the terminals 18, 20 and 22 correspond to connections made to a base region, a collector region and an emitter region, respectively, of the semiconductor chip 15. In most instances, the collector region of the semiconductor chip 15 is mounted directly to the heat sink 14 as well as to one of the terminals 20.

The test socket 12 comprises a first surface 26 having receptor holes 28, 30 and 32 therein into which the base, collector, and emitter terminals fit and are held in place by conventional retaining means (not shown) within the socket 12. Extending from another surface 34 of the test socket 12 are a plurality of leads 36, 38 and 40 which correspond and contact the base, the collector and the emitter terminals, 18, 20 and 22 respectively, internal to the test socket 12. These leads, 36, 38 and 40 can be connected to power and monitoring means 42. Hence, power can be provided to the base, collector and emitter regions of the semiconductor chip 15 via the leads 36, 38 and 40 contacting the terminals 18, 20 and 22 and currents and voltages appearing on the chip 15 can be monitored via these same leads 36, 38 and 40. It will be noted that each lead, 36, 38 or 40, can contain a plurality of individual conductors, for example, so that power can be applied to the device 10 by conductors which are insulated from monitoring conductors.

A fluid 44 which is relatively cold compared to the test temperature is directed from a fluid source 46 toward the semiconductor device 10 through a fluid flow line 48. This cooling step can take place in a conventional room ambient and as such can be considered as a localized cooling step. The fluid source 46 can be liquid carbon dioxide, freon, or the like. Preferably, the fluid source is liquified carbon dioxide, i.e., gaseous carbon dioxide under a pressure of about 1000 pounds per square inch. The fluid 44 is directed at the semiconductor device 10 by means of a nozzle 50 attached to the fluid flow line 48 and is preferably positioned about an ⅛ of an inch away from the heat sink 14 of the device 10. By directing the fluid 44 upon the heat sink 14 a more rapid cooling of the semiconductor chip 15 mounted thereon is accomplished. The duration of the fluid flow upon the device 10 is generally dependent on not only the size and shape of the body 16 but also on the temperature to which the device 10 is to be reduced. For example, in the device 10, which is typical of known plastic package devices in the art, a flow duration of between from about 150 milliseconds to about 500 milliseconds reduces the temperature of the device 10 from room temperature to i.e., about 25° C. to between from about −50° C. to about −° C.

The duration of the fluid flow can be controlled either manually or automatically by a control means 52 such as a solenoid valve, inserted in the fluid flow line 48 between the fluid source 46 and the nozzle 50. However, since the duration of the fluid flow is quite short, it is preferred that the control means 52 be connected via a control line 54 to a timing device (not shown). The timing device can be a computer mechanism.

After the device 10 is cooled, it is internally heated to the test temperature. In order to accurately heat the device 10 it is preferred that the temperature of the semiconductor chip be determined prior to the heating step. This temperature determination can be made through the monitoring means 42 via the leads 36, 38 and 40 by placing a particular current through the chip 15 and measuring the resulting voltage across at least one of the PN junctions in the chip 15. This temperature determining step is most accurate where the heat sink 14 and the semiconductor chip 15 have reached substantial thermal equilibrium. Thus, a short period of time should elapse between the end of the fluid flow and the temperature determining step. A period of about 150 milliseconds has been found to be sufficient for most devices. For consistent and accurate temperature determination, the particular type of device under test is precalibrated by testing a number of similar devices in a temperature chamber. The particular current and voltage characteristics of at least one of the PN junctions therein is then determined at a variety of temperatures. By utilizing this data, the internal temperature, i.e., the temperature of the chip 15 of the semiconductor device can be readily determined by measuring the voltage across a PN junction for a given current.

After determining the extent to which the chip 15 has been cooled, the device 10 is internally heated to the test temperature. This internal heating can be performed by a number of methods, for instance, the device 10 can simply be left alone in a room ambient and continually or occasionally monitored to determine when the chip 15 reaches the test temperature. Alternatively, and preferably since it is faster, at least one of the PN junctions within the device, in this instance the base-emitter PN junction and the base-collector PN junction, can be turned on and off by small pulses of current, for example, using pulses about 25 to about 225 millisecond duration. The amount of current injected is dependent on the size and capability of the device 10. Generally, present day specifications require that electrical tests be performed at somewhere between $-30°$ and $-40°$ C. In the case wherein the temperature of the device 10 has been initially reduced to about $-60°$ C. the pulsing time usually required to reach about $-40°$ C. is on the order of between 50 and 500 milliseconds.

When the internal temperature of the PN junctions has reached the test temperature, the device 10 is turned off and the surrounding area of the chip 15 is allowed to reach thermal equilibrium with the PN junctions. This usually takes on the order of about 50 milliseconds.

After the substantial thermal equilibrium has been reached, the electrical characteristics tests are performed on the device 10 at the test temperature. These tests can be performed manually, although an automated testing apparatus is preferable since the automated test apparatus is considerably faster and thus there is less time for the internal temperature of the device 10 to change between the beginning of the tests and the end of the tests. To insure that device 10 has not substantially charged temperature during the testing, it is preferred that the internal temperature be determined after the tests are complete.

The device 10 is then allowed to return to room temperature and may be assisted by utilizing small pulses of current to generate heat within the device 10. Once the device 10 is again at room temperature, it is removed and another device is inserted into the test socket 12.

The method described above is advantageous in that it is compatible with production line techniques. For example, experimentation has shown that for testing a batch of about 200 devices utilizing a temperature chamber, a testing period of about 20 hours is required whereas by utilizing the above-described method the same tests can be performed within, at the most, 3 hours. The reduced testing time is primarily because of the relatively unencumbered rapid cooling of the device under test. Another advantage of this method of testing is that it can be performed in a conventional room ambient and the need for temperature chambers is greatly reduced.

What is claimed is:

1. A method of testing a semiconductor device which has a semiconductor chip integral therewith, at a particular test temperature which is much lower than room temperature, said chip having at least one PN junction therein, comprising the steps of:
   locally directing a fluid which is at a temperature lower than said test temperature upon said device for a time long enough to reduce the temperature of said device below said test temperature;
   stopping the fluid flow;
   internally heating said device to said test temperature; and
   performing at least one electrical test on said device at said test temperature.

2. A method as claimed in claim 1 further comprising the step of:
   determining the internal temperature of said device prior to said internal heating step.

3. A method as claimed in claim 2 further comprising the step of:
   determining the internal temperature of said device after said device has substantially reached thermal equilibrium.

4. A method as claimed in claim 1 further comprising the step of:
   determining the internal temperature of said device after said device has substantially reached thermal equilibrium.

5. A method as claimed in claim 1 further comprising the step of:
   determining the internal temperature of said device prior to said test performing step.

6. A method as claimed in claim 1 wherein said device includes a heat sink and said directing step comprises:
   directing a flow of liquid carbon dioxide at said heat sink of said device for less than about 500 milliseconds.

7. A method as claimed in claim 1 wherein said internal heating step comprises the step of:
   injecting at least one pulse of current across said PN junction.

8. A method as claimed in claim 1 wherein:
   said directing step is carried out until the temperature of said device is about $-60°$ C. and
   said internally heating said device is carried out until the temperature of said device is about $-40°$ C.

* * * * *